United States Patent
Seol et al.

(10) Patent No.: US 7,929,349 B2
(45) Date of Patent: Apr. 19, 2011

(54) METHOD OF OPERATING NONVOLATILE MEMORY DEVICE

(75) Inventors: Kwang-soo Seol, Suwon-si (KR); Sang-jin Park, Pyeongtaek-si (KR); Sung-hoon Lee, Yogin-si (KR); Sung-il Park, Suwon-si (KR); Jong-seob Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 409 days.

(21) Appl. No.: 12/071,961

(22) Filed: Feb. 28, 2008

(65) Prior Publication Data

US 2008/0205157 A1 Aug. 28, 2008

(30) Foreign Application Priority Data

Feb. 28, 2007 (KR) .................. 10-2007-0020622
Apr. 16, 2007 (KR) .................. 10-2007-0037166

(51) Int. Cl.
*G11C 11/34* (2006.01)

(52) U.S. Cl. ......... 365/185.18; 365/185.19; 365/189.09; 365/207; 365/226

(58) Field of Classification Search ............. 365/185.18, 365/185.22, 185.19, 185.29
See application file for complete search history.

(56) References Cited

U.S. PATENT DOCUMENTS

| | | | |
|---|---|---|---|
| 3,995,216 A * | 11/1976 | Yun ........................ | 324/762.01 |
| 6,567,312 B1 | 5/2003 | Torii et al. | |
| 6,791,868 B2 * | 9/2004 | Gider et al. ................... | 365/158 |
| 2003/0103384 A1 | 6/2003 | Takahashi | |
| 2003/0133329 A1 * | 7/2003 | Satoh ....................... | 365/185.22 |
| 2005/0057979 A1 * | 3/2005 | Mokhlesi et al. ............. | 365/199 |
| 2005/0232009 A1 * | 10/2005 | Nakamura ............... | 365/185.08 |
| 2007/0036001 A1 | 2/2007 | Kanda et al. | |
| 2008/0145951 A1 * | 6/2008 | Folks et al. ....................... | 438/3 |
| 2008/0205156 A1 | 8/2008 | Seol et al. | |

FOREIGN PATENT DOCUMENTS

JP 2003-173690 6/2003

OTHER PUBLICATIONS

C.T. Swift et al., "An Embedded 90nm SONOS Nonvolatile Memory Utilizing Hot Electron Programming and Uniform Tunnel Erase", p. 927-930, Technical Digest of International Electron Device Meeting (IEDM Dec. 2002,).

R.D.Gould et al., "Dielectric properties of RF-sputtered silicon nitride thin films with gold electrodes", Thin Solid Films 433 (2003) 309-314.

* cited by examiner

*Primary Examiner* — Pho M Luu
*Assistant Examiner* — Tha-O Bui
(74) *Attorney, Agent, or Firm* — Harness, Dickey & Pierce, PLC

(57) ABSTRACT

Provided is a method of operating a nonvolatile memory device to perform a programming operation or an erase operation. The method includes applying a composite pulse including a direct current (DC) pulse and an AC perturbation pulse to the nonvolatile memory device to perform the programming operation or the erase operation.

15 Claims, 16 Drawing Sheets

METHOD OF OPERATING NONVOLATILE MEMORY DEVICE

PRIORITY STATEMENT

This application claims the benefit of Korean Patent Application No. 10-2007-0020622, filed on Feb. 28, 2007 and 10-2007-37166, filed on Apr. 16, 2007, in the Korean Intellectual Property Office, the disclosure of which is incorporated herein in its entirety by reference.

BACKGROUND

1. Field

Example embodiments relate to a method of operating a nonvolatile memory, and more particularly, to a method of operating a nonvolatile memory, which improves the stability of programming and/or erasing states by accelerating charge stabilization and recombination of electrons and holes.

2. Description of the Related Art

Non-volatile memory devices are semiconductor memory devices that can preserve stored data even when the supply of power is cut off.

A structure of a memory cell, that is, a basic element of the non-volatile memory device, varies according to the application fields of the non-volatile memory device.

In the case of NAND flash semiconductor memory devices, that is, high-capacity non-volatile semiconductor memory devices, a gate of a transistor may have a structure in which a floating gate storing charges (e.g., data) and a control gate controlling the floating gate are sequentially stacked.

With regard to flash semiconductor memory devices, in order to satisfy the demands for larger memory capacities, the size of the memory cell has been reduced. In addition, in accordance with the reduction of the cell size, a height of the floating gate may also need to be reduced.

In order to maintain a memory property of the memory cell, for example, a retention property for preserving the stored data for a sufficiently long time, and at the same time, to reduce the vertical height of the memory cell, semiconductor memory devices having a SONOS (Silicon-Oxide-Nitride-Oxide-Semiconductor) memory devices using a silicon nitride layer (Si3N4), and not a floating gate as a unit for storing charges and a MOIOS (Metal-Oxide-Insulator-Oxide-Semiconductor) structure such as MONOS (Metal-Oxide-Nitride-Oxide-Semiconductor) memory devices, have been suggested. In the case of a SONOS device, silicon is used for the control gate, and in the case of a MONOS device, a metal is used for the control gate.

SONOS and MONOS memory devices use a charge trap layer such as the silicon nitride layer (Si3N4) as a unit for storing charges, instead of a floating gate. That is, in the SONOS and MONOS memory devices, the stacked structure (the floating gate and insulating layers stacked on/under the floating gate) between a substrate and the control gate is substituted by a stacked structure (ONO) in which an oxide layer, a nitride layer, and an oxide layer are sequentially stacked in the memory cell. Thus, the SONOS and the MONOS memory devices may be considered charge trap flash (CTF) memory devices wherein a threshold voltage is shifted when the charges are trapped by the nitride layer.

A basic structure of the SONOS type memory device may be as follows. A first silicon oxide layer (SiO2), that is, a tunnel insulating layer, having ends contacting source and drain regions, may be formed on a semiconductor substrate between the source and the drain regions, that is, on a channel region. The first silicon oxide layer may be a layer for tunneling charges. A silicon nitride layer (Si3N4) may be formed on the first silicon oxide layer as a charge trap layer. The silicon nitride layer may be a material layer substantially storing data, and the charges tunneled through the first silicon oxide layer may be trapped by the silicon nitride layer. A silicon oxide layer may be formed on the silicon nitride layer as a blocking insulating layer for blocking the charges from moving upward after passing through the silicon nitride layer. A gate electrode may be formed on the second silicon oxide layer.

However, in the SONOS memory device having the above structure, the dielectric constants of the silicon nitride layer and the silicon oxide layers are relatively low, and a density of a trap site in the silicon nitride layer may not be sufficient. Therefore, an operating voltage of the memory device is higher, and a speed of recording data (programming rate) may not be fast enough and charge retention times in vertical and horizontal directions may not be long enough.

Recently, it has been reported that the programming rate and the retention characteristic may be improved when an aluminum oxide layer (Al2O3) having a larger dielectric constant than that of the silicon oxide layer is used instead of the silicon oxide layer as the blocking insulating layer.

In a CTF memory device having a charge trap layer instead of the floating gate, electrons are injected into the charge trap layer during programming, and holes are injected into the charge trap layer during erasing to remove the electrons stored in the charge trap layer using a recombination of the holes and electrons.

However, the electrons injected in an initial programming procedure for an unused CTF memory device may be trapped by the charge trap layer and localized, and then, the electrons may be spatially spread while being thermalized into a deep trap in the nitride layer. Thus, a threshold voltage of the device may be changed, and thus, it may take some time until the threshold voltage (Vth) is fixed according to thermalization of the located electrons.

The variation of the time-dependent threshold voltage may Vth make it difficult to control a dispersion of the threshold voltage values when an incremental step pulse programming (ISPP) method is used.

According to an ISPP method, program pulse voltages may be applied while increasing the magnitudes thereof, and verifying voltages may be applied to identify the threshold voltage of the memory cell, and then, the above may be repeated until the threshold voltage of the memory cell reaches a desired value. Because the initial threshold voltages of the plurality of memory cells forming the memory device may be highly dispersed, the ISPP method may be used so that all of the memory cells may have the desired threshold voltages in consideration of the dispersion between the threshold voltages in the plurality of memory cells.

However, if the threshold voltage is changed in time, it may be more difficult to control the dispersion between the threshold voltages using the ISPP method, and it is not easy to program the memory cells to have the threshold voltages within a desired range.

When the programmed information is erased, injected holes and the localized electrons or the non-localized electrons that are de-trapped by a field may be recombined, and the remaining holes and the localized electrons that are not completely removed may be re-distributed.

During the recombination of the electrons-holes and the re-distribution of the charges, the threshold voltage of the memory device may be changed, and thus, an effective erase time may be considered as a sum of the times taken to perform the re-combination and the re-distribution, not the time of injecting the holes.

A distribution of lifetimes of the electrons-holes (recombination time) measured after optical pumping in a silicon nitride layer fabricated using a low-pressure chemical vapor deposition (LPCVD) method is disclosed in K. S. Seol et al., Phys. Rev. B 62, 1532 (2000).

The recombination times of the electrons and holes may be distributed over a wide range, for example, from ns to ms. According to an LESR (Light-induced Electron Spin Resonance) measurement result, the recombination time may be several $10^3$ seconds.

The recombination time ($\tau$) of the localized electrons and holes may be calculated using equation 1.

$$\tau = \tau 0 \exp(2R/R0) \; (\tau 0 = 10-8 \; s) \quad (1)$$

where, R0 denotes a localization length of the electron or the hole, and satisfies $R0(E) = [h2/m(Ec-E)]^{1/2}$ or $[h2/m(Ev-E)]^{1/2}$, and R denotes a distance between the localized electron and the localized hole.

As shown in equation 1, R0 may be reduced in a deep trap, and the recombination time may be increased in the deep trap.

In the erase mode, the injected holes may be stabilized to a deep energy level as time passes.

In the programming mode or the erase mode, the variation of the threshold voltage may be large when the charges are spatially spread and the thermalization is generated. When the thermalization advances further, the change in threshold voltage may be reduced, however, the charges may be localized to a deeper energy level and thus may be more difficult to move.

Therefore, if the recombination takes a long time, the electrons or the holes that are thermalized and localized to the deep energy level according to the elapsed time may not be able to move, and thus, it may be more difficult to recombine the electrons and the holes. In addition, when the movement of the electrons or the holes is limited due to thermalization, the thermalization time may increase.

In addition, when the recombination time is long, the charges may be thermalized according to the elapsed time, and thus, a sufficient recombination of holes-electrons may not be performed. Due to the incomplete recombination, when the trapped electrons remain after performing the erase operation, dispersion may be increased in the programming operation.

For example, in a state where the electrons, as well as the holes, remain due to incomplete recombination of the electrons and holes in the erase mode, even if the same number of electrons as holes, that remain in a case of complete recombination, are injected, the electrons and the holes may be incompletely recombined, and thus, electrons and the holes may exist together. Even though a number of electrons are additionally injected, the recombination may be still incomplete and thus the holes may still exist. The remaining holes may be recombined with the electrons and may cause the change in the threshold voltage when performing the programming process by repeating the electron injection and the verifying using the ISPP method, and thus, the dispersion in the threshold voltages may increase when the programming is completed.

As described above, the existence of the opposite charge due to the incomplete recombination may cause dispersion in the programming operation, and the increase of the dispersion may be prevented only by completely removing the electrons in the erase mode.

When the opposite charges exist due to incomplete recombination, the recombination of the electrons and holes may be performed in a high temperature storage (HTS) operation, and thus, the threshold voltage value may be changed.

Therefore, when the incomplete recombination occurs due to the long thermalization time and the long recombination time, the stabilities of the erase state and the program state may be degraded, the dispersion of the threshold voltage values may be degraded in the programming or the erasing operation, and the threshold voltage may be changed in the HTS operation.

SUMMARY

Example embodiments provide a method of operating a charge trap flash memory device, which may ensure a greater stability in programming/erase states by improving a thermalization speed of charges and/or a recombination rate of electrons and holes so as to reduce or prevent opposite charges from remaining in a charge trap layer in the programming state or the erase state.

According to example embodiments, there is provided a method of operating a nonvolatile memory device to perform at least one of a programming operation and an erase operation, the method comprising applying a composite pulse including a direct current (DC) pulse and an alternating current (AC) perturbation pulse to the nonvolatile memory device to perform at least one of the programming operation and the erase operation.

According to example embodiments, there is provided a method of operating a NAND charge trap memory device to perform a programming operation, the method comprising applying a composite pulse including a direct current (DC) pulse and a DC perturbation pulse to the NAND charge trap memory device to perform the programming operation.

In the composite pulse, the DC pulse may be followed by the AC perturbation pulse.

The composite pulse may include the DC pulses and the AC perturbation pulses that are alternately arranged a plurality of times.

The composite pulse may include the DC pulse and the AC perturbation pulse overlapping with a DC level that has the same polarity as that of the DC pulse and has a smaller magnitude, wherein the DC pulse and the AC perturbation pulse are alternately arranged a plurality of times.

The composite pulse may include the DC pulse for a predetermined period, and the AC perturbation pulse may overlap with the DC pulse.

The AC perturbation pulse may have a frequency that is higher than an inverse of the time period including the DC pulse.

The composite pulse may include the DC pulse followed by the perturbation pulse, and the perturbation pulse may have a DC level having opposite polarity to that of the DC pulse.

A magnitude of the DC level in the perturbation pulse may be smaller than that of the DC pulse.

A charge trap memory device may include: a substrate; and a gate structure on the substrate, wherein the gate structure includes a tunnel insulating layer, a charge trap layer, a blocking insulating layer, and/or a gate electrode.

The tunnel insulating layer may be an oxide layer, the charge trap layer may be a nitride layer, the blocking insulating layer may include a high dielectric material, and the gate electrode may be formed of a metal layer.

The composite pulse may be applied to the gate electrode in the program mode, and the composite pulse may be applied to the substrate in the erase mode.

The perturbation pulse may accelerate a recombination or a redistribution of charges.

A verifying pulse may be applied after applying the composite pulse to verify the program state or the erase state.

The application of the composite pulse and the application of the verifying pulse may be performed while increasing (for example, gradually) the DC pulse of the composite pulse in the program mode.

The DC pulse may be a basic pulse of the programming operation or the erase operation.

Example embodiments of composite pulses and methods of programming and/or erasing may be applied to various non-volatile memories, for example flash memories. Example embodiments of composite pulses and methods of programming and/or erasing may be applied to floating gate memories and/or charge trap memories. Example embodiments of composite pulses and methods of programming and/or erasing may be applied to NAND memories and/or NOR memories.

BRIEF DESCRIPTION OF THE DRAWINGS

Features and advantages of example embodiments will become more apparent by describing in detail example embodiments thereof with reference to the attached drawings in which:

FIGS. 18A and 18B show an example of a circuit diagram of a NAND flash memory device driven using example embodiments, wherein FIG. 18A shows a programming operation state, and FIG. 18B shows an erase operation state.

DETAILED DESCRIPTION OF EXAMPLE EMBODIMENTS

Figure 1:
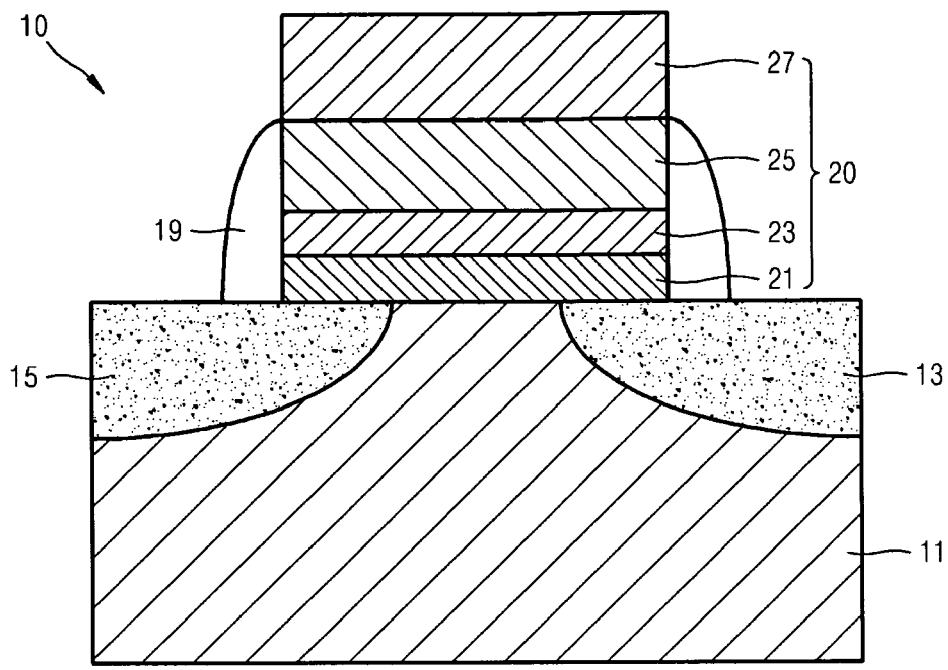
FIG. 1 is a cross-sectional view of a charge trap flash memory device that performs a programming operation or an erase operation using a method according to example embodiments.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of operating a charge trap flash memory device according to example embodiments will be described in detail with reference to accompanying drawings.

FIG. 1 shows an example of a charge trap flash memory device 10 that performs a programming operation or an erase operation using a method according to example embodiments.

Referring to FIG. 1, the charge trap flash memory device 10 may include a substrate 11 and a gate structure 20 formed on the substrate 11.

A first impurity region 13 and a second impurity region 15, in which predetermined or desired conductive impurities are doped, may be formed on the substrate 11. One of the first and second impurity regions 13 and 15 may be used as a drain D, and the other may be used as a source S.

The gate structure 20 may include a tunnel insulating layer 21 formed on the substrate 11, a charge trap layer 23 formed on the tunnel insulating layer 21, and/or a blocking insulating layer 25 formed on the charge trap layer 23. A gate electrode 27 may be formed on the blocking insulating layer 25. In FIG. 1, reference numeral 19 denotes an optical spacer.

The tunnel insulating layer 21 is a layer for tunneling charges, and may be formed on the substrate 11. The tunnel insulating layer 21 may electrically contact the first and second impurity regions 13 and 15. The tunnel insulating layer 21 is a tunnel oxide layer that may be formed, for example, of $SiO_2$, various high-k oxide materials, or combinations of oxide materials.

Also, the tunnel insulating layer 21 may be formed as a silicon nitride layer, for example, $Si_3N_4$. The silicon nitride layer may be formed not to have a high impurity concentration (that is, the concentration of impurities may be comparable to that of the silicon oxide layer) and to have a sufficient interfacial property with silicon. In order to form the silicon nitride layer of sufficient quality, the silicon nitride layer forming the tunnel insulating layer 21 may be formed using a method such as a jet vapor deposition method.

When the silicon nitride layer is formed using the above method, a defectless silicon nitride layer ($Si_3N_4$) having an impurity concentration not higher than that of the silicon oxide layer and having good interfacial property may be formed.

Otherwise, the tunnel insulating layer 21 may be formed to have a double-layered structure including the silicon nitride layer and the oxide layer.

As described above, the tunnel insulating layer 21 may be formed as a single-layered structure of the oxide layer or the nitride layer, or a multi-layered structure formed of materials having different energy band gaps from each other.

The charge trap layer 23 is an area for storing information by charge trapping. The charge trap layer 23 may be formed to include one or more of polysilicon, a nitride material, a high-k dielectric material having a high dielectric constant, and nanodots.

For example, the charge trap layer 23 may be formed of a nitride material such as $Si_3N_4$, or a high-k oxide material such as $SiO_2$, $HfO_2$, $ZrO_2$, $Al_2O_3$, HfSiON, HfON, or HfAlO.

In addition, the charge trap layer 23 may include a plurality of nanodots that are discontinuously arranged as the charge trap site. The nanodots may be formed as nanocrystals.

The blocking insulating layer 25 is for blocking the charges from passing through the charge trap layer 23 and moving further, and may be formed of an oxide layer.

The blocking insulating layer 25 may be formed of $SiO_2$, or a high-k material having a higher dielectric constant than that of the tunnel insulating layer 21, for example, $Si_3N_4$, $Al_2O_3$, $HfO_2$, $Ta_2O_5$, or $ZrO_2$. The blocking insulating layer 25 may be formed to have a multi-layered structure, for example, the blocking insulating layer 25 may be formed to have two or more layers including an insulating layer formed of an insulating material such as $SiO_2$, and a high dielectric layer formed of a material having a higher dielectric constant than that of the tunnel insulating layer 21.

The gate electrode 27 may be formed as a metal layer. For example, the gate electrode 27 may be formed of aluminum (Al), Ru or TaN metal that may generally be used as the gate electrode of a semiconductor memory device, or a silicide material, such as NiSi.

Other SONOS or MONOS features, for example, those described in "An Embedded 90 nm SONOS Nonvolatile Memory Utilizing Hot Electron Programming and Uniform Tunnel Erase" by C. T. Swift, et al., pages 927 to 930, Technical Digest of International Electron Device Meeting (IEDM December, 2002) may be added to or replace those described above and the subject matter of this publication is incorporated by reference in its entirety.

When electrons are injected into the charge trap flash memory device, the injected electrons are trapped by the trap site of the charge trap layer, and thus, a programming operation may be performed so that a threshold voltage becomes a voltage of a programmed state, for example, 3V, or holes are injected into the memory device so that the electrons may be removed by the recombination of the electrons-holes, and thus, an erase operation may be performed so that the threshold voltage becomes a voltage of an erased state, for example, 0V. As described above, the memory cell in the flash memory device may have two states, that is, a programming state and an erase state. The ON-status, in which the threshold voltage of the memory cell is reduced so that an electric current flows to the drain that is connected to a bit line by the voltage applied to the gate electrode 27 during reading the memory device, is the erase state. The OFF-status, in which the threshold voltage of the memory cell is increased so that the electric current does not flow to the drain that is connected to the bit line by the voltage applied to the gate electrode 27 during reading the memory device, may be termed the programming state.

As described above, a voltage of composite pulses including direct current (DC) pulses and perturbation pulses may be applied to perform the programming operation or the erase operation, and thus, the charges (electrons and/or holes) may be more rapidly thermalized during the programming operation or the erase operation and incomplete recombination of the electrons-holes in the erasing operation may be reduced or prevented. The DC pulse may be a basic pulse of the programming operation or the erase operation. The perturbation pulse may be an AC perturbation pulse or a DC perturbation pulse.

When the composite pulse shown in FIGS. 2 through 5 is applied to a charge trap flash memory device, the programming operation or the erase operation may be performed.

During the programming operation, the composite pulse shown in FIGS. 2 through 5 may be applied to the gate electrode 27 and the substrate 11 may remain intact at, for example, 0V. In addition, during the erase operation, the composite pulse shown in FIGS. 2 through 5 may be applied to the substrate 11 and the gate electrode 27 may remain intact at, for example, 0V.

Figure 2:
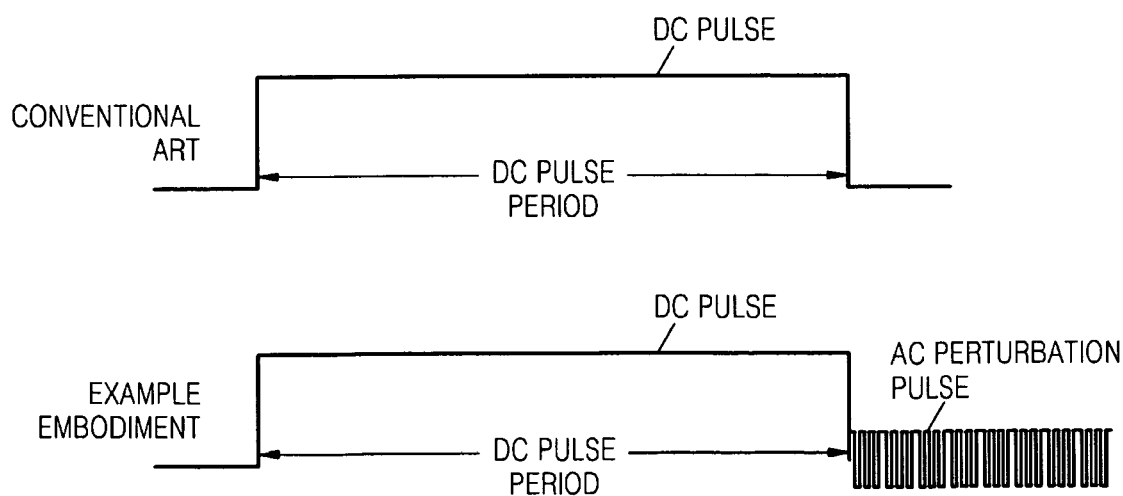
FIG. 2 is a diagram showing a composite pulse according to example embodiments in comparison to a direct current (DC) pulse according to the conventional art.

Therefore, from the perspective of the gate electrode 27, the programming voltage is a positive voltage, and the erasing voltage is a negative voltage, and the basic pulse structures of the voltages are the same except for the DC pulse section and the perturbation pulse frequency. Therefore, the composite pulse shown in FIGS. 2 through 5 may be commonly applied in the programming operation and the erase operation. FIG. 2 illustrates the composite pulse used in the method of operating the charge trap flash memory device according to example embodiments in comparison to the DC pulse according to a conventional method.

As shown in FIG. 2, the voltage applied to perform a conventional programming operation or a conventional erase operation only includes the DC pulse component. A DC pulse time period, in which the DC pulse is applied, may be about 10 μs in the programming mode, and about 10 ms in the erase mode.

On the other hand, the composite pulse applied to perform the programming operation or the erase operation according example embodiments may include a DC pulse (program pulse or erase pulse) component and a perturbation pulse component. The DC pulse may be a basic pulse of the programming operation or the erase operation.

The perturbation pulse component may accelerate the recombination or redistribution of =charges, and may have a predetermined or desired value (for example, amplitude and/or duration).

In example embodiments of FIG. 2, the perturbation pulse is an AC perturbation pulse. The AC perturbation pulse may have a frequency that is higher than the inverse of the DC pulse time period.

In FIG. 2, the composite pulse applied to perform the programming operation or the erase operation may include the DC pulse for a predetermined or desired time period followed by the AC perturbation pulse.

The predetermined or desired time period may correspond to the DC pulse period in the conventional programming or erase voltage including the DC pulse only. That is, the voltage applied to perform the conventional programming operation or the conventional erase operation only includes the DC pulse components, however, the composite pulse applied to perform the programming or the erase operation of the example embodiments may include the DC pulse corresponding to the conventional DC pulse and the perturbation pulse that accelerates the thermalization of the charges and/or the recombination of the electrons and holes.

Figure 3:
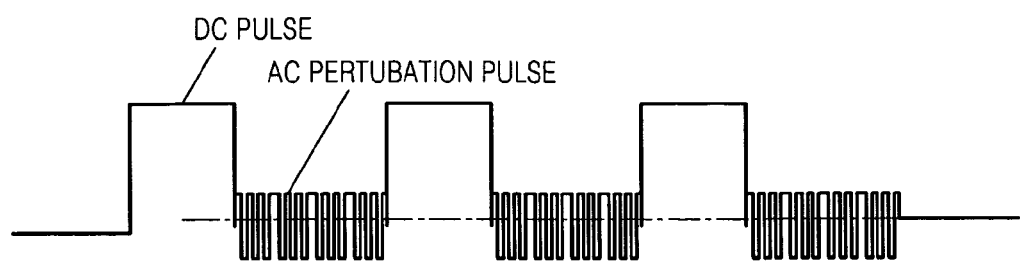
FIGS. 3 through 5 are diagrams showing composite pulses according example embodiments.
Figure 4:
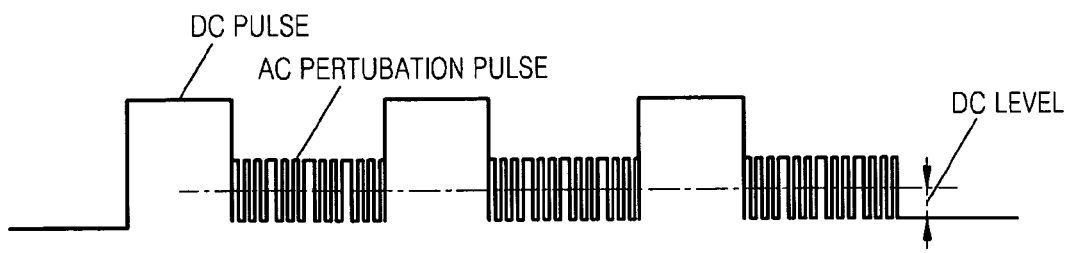
Figure 5:
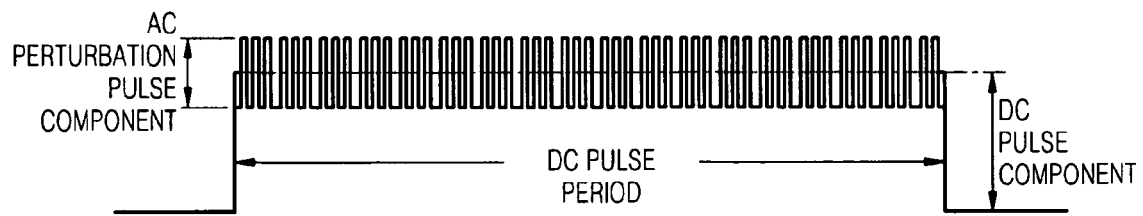

In the composite pulse of FIG. 2, the DC pulse period may be about 10 μm in the programming mode, and about 10 ms in the erase mode. In example embodiments, in the programming mode, the AC perturbation pulse component may be an AC pulse having a frequency that is higher than $1/10$ μs=0.1 MHz, and in the erase mode, the AC perturbation pulse component may be an AC pulse having a frequency that is higher than $1/10$ ms=100 Hz. In FIGS. 3 through 5, the perturbation pulse in the composite pulse is also an AC perturbation pulse, and the AC perturbation pulse may satisfy the above frequency ranges like example embodiments shown in FIG. 2.

FIGS. 3 through 5 show composite pulses according to a method of operating a charge trap flash memory device according to example embodiments.

Referring to FIG. 3, the composite pulse of the example embodiments may include DC pulses and AC perturbation pulses that are repeatedly and alternately provided a plurality of times (N times, when N≧2). In FIG. 3, the composite pulse applied to perform the programming operation or the erase operation includes three pairs of DC pulses and AC perturbation pulses.

Referring to FIG. 4, the composite pulse of example embodiments include DC pulses and AC perturbation pulses and overlapping with a DC level that has the same polarities as that of the DC pulse and is smaller than the DC pulse signal, which are alternately provided for a plurality of times. In FIG. 4, the composite pulse includes three pairs of DC pulses and DC level+AC perturbation pulses (overlapping).

Referring to FIG. 5, the composite pulse of example embodiments may include the DC pulse and the AC perturbation pulse overlapping with the DC pulse. In example embodiments, the DC pulse period of the voltage may correspond to the DC pulse period of the conventional voltage including only the DC pulse.

In the programming mode, the programming voltage formed as the composite pulse that is one of the composite pulses shown in FIGS. 2 through 5 may be applied to a memory cell of a charge trap flash memory device to perform the programming operation. In addition, a verifying voltage may be applied to the memory cell so as to perform a program verification operation.

When an ISPP method is used for programming, the processes of applying the programming voltage to perform the programming operation and applying the verifying voltage to identify the threshold voltage of the memory cell may be repeated until the threshold voltage of the memory cell reaches the program status.

In the erase mode, the erase voltage formed as the composite pulse that is one of the composite pulses shown in FIGS. 2 through 5 may be applied to a memory cell of a charge trap flash memory device to perform an erase operation. In addition, the verifying voltage may be applied to a memory cell in order to identify whether the memory cell is erased.

As described above, a verifying pulse voltage may be applied in order to identify the programming state or the erase state before or after the application of the composite pulse voltage. Performing a verifying operation by applying a verifying voltage is well known in the art. In addition, as will be described later, the programming voltage and the verifying voltage may have the same polarity, and the erase voltage and the verifying voltage may have opposite polarities to each other. Therefore, the verifying pulse has been omitted in FIGS. 2 through 5 in order to describe that the composite pulses shown in FIGS. 2 through 5 may be commonly applied as the programming voltage or the erase voltage.

In the programming operation, the application of the composite pulse and the application of the verifying pulse may be performed while gradually increasing a magnitude of the DC pulse in the composite pulse shown in FIGS. 2 through 5. That is, programming may be performed in the ISPP method using the composite pulses shown in FIGS. 2 through 5.

Figure 6:
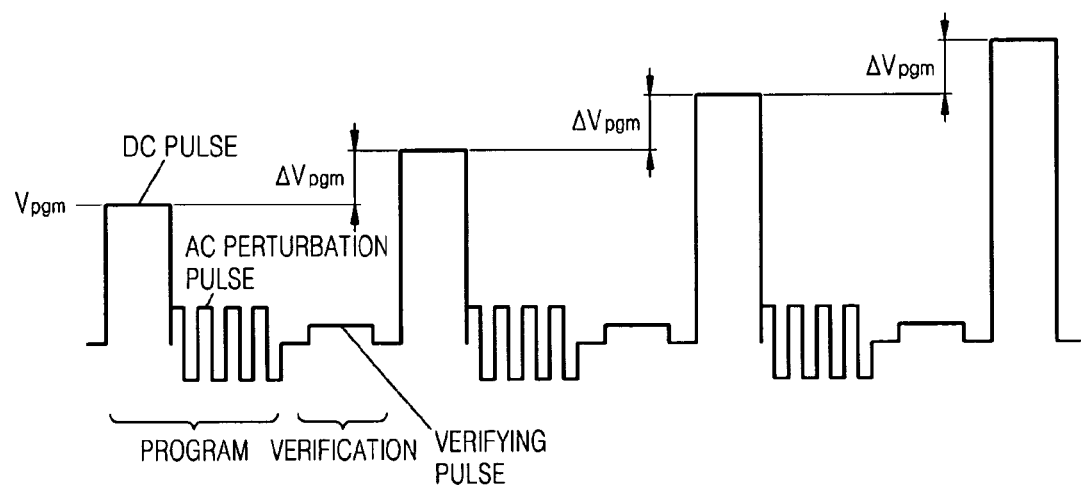
FIG. 6 is an example diagram showing a programming voltage when the composite pulse of FIG. 2 is applied to programming using an ISPP method.

FIG. 6 shows a programming voltage when the composite pulse of FIG. 2 is applied in the programming operation using an ISPP method. In FIG. 6, Vpgm denotes a magnitude of the basic DC pulse voltage contributing to the programming operation in the programming of ISPP method, and ΔVpgm denotes an increased amount of the DC pulse voltage. As shown in FIG. 6, the application of the composite pulse including the DC pulse and the AC perturbation pulse and the application of the verifying pulse voltage (Vref) may be performed while increasing (for example, gradually) the magnitude of the DC pulse voltage.

When programming is performed using an ISPP method as shown in FIG. 6, the magnitude of the AC perturbation pulse may be constant, or may be increased according to the increase of the DC pulse magnitude. In addition, the AC perturbation pulse may be an appropriate magnitude within a range of accelerating the recombination or the redistribution of the charges, and thus, the voltage magnitude of the verifying pulse may be the same as the AC perturbation pulse, smaller, or greater than the AC perturbation pulse.

Because the programming voltages when the composite pulses shown in FIGS. 3 through 5 are applied to the programming operation using the ISPP method are similar to those described above with respect of FIG. 2, and descriptions for those will be omitted.

As described above, according to methods of operating the charge trap flash memory device when performing a programming or an erase operation using the composite pulses described with reference to shown in FIGS. 2 through 6, the charges may be actively moved by the perturbation caused by the AC perturbation pulse component after injecting the charges (electrons in the programming mode, and holes in the erase mode), and thus, the times required to perform the thermalization of the charges and/or the recombination of the electrons and holes may be reduced.

The thermalization and recombination rates may be increased by the AC perturbation as described in a document related to a frequency dependence of an AC conductivity in R. D. Gould and S. A. Awan, Thin Solid Films, 443, 309 (2003), the entire contents of which, is hereby incorporated by reference.

Figure 7:
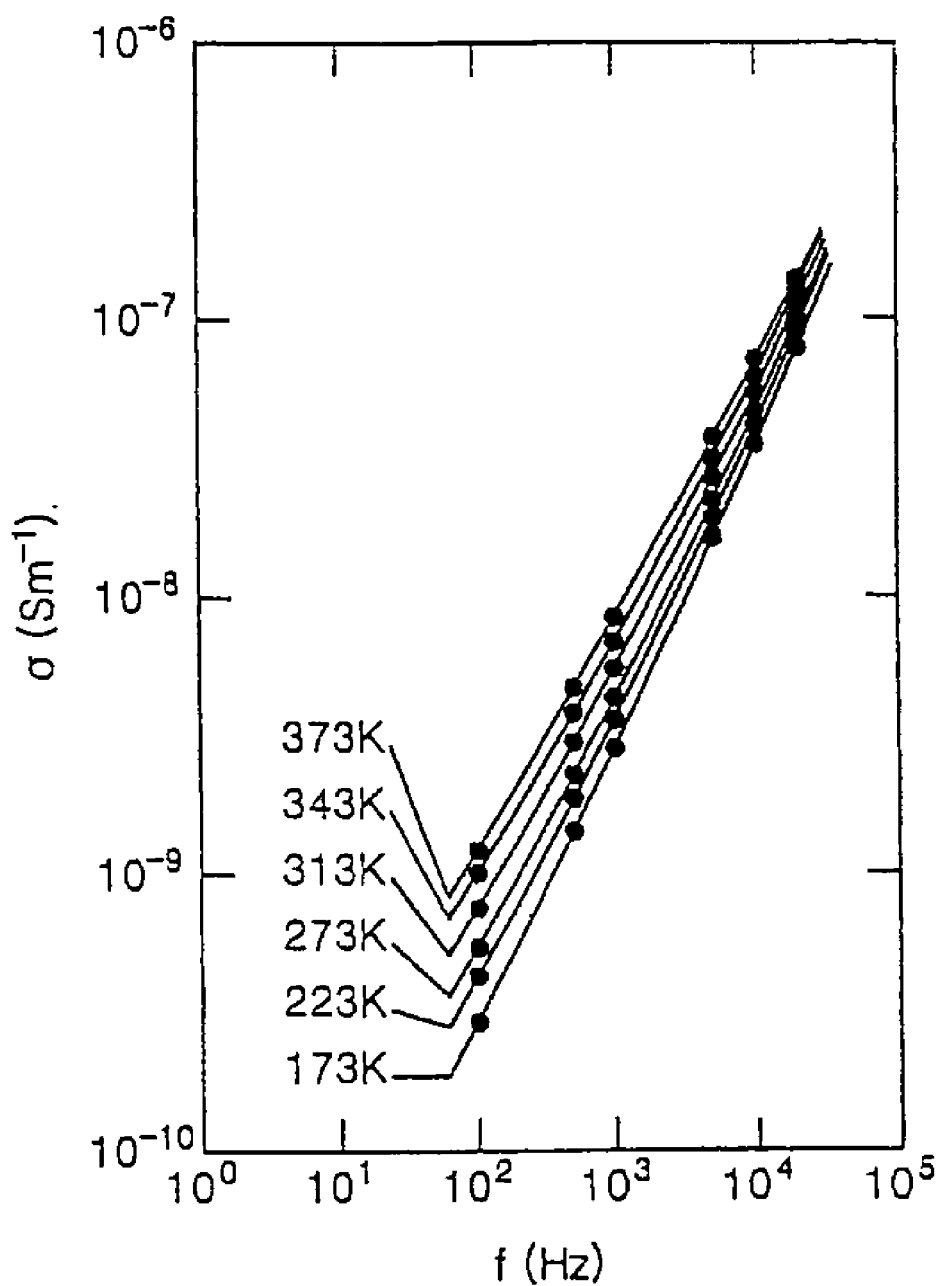
FIG. 7 is a graph showing conventional frequency dependabilities of AC conductivity.

FIG. 7 is an example graph showing the AC conductivity dependence on the frequency disclosed in the above document.

As shown in FIG. 7, the AC conductivity increases when the AC frequency increases, and the AC conductivity is very large in a range of hundreds of Hz to a few MHz, that is, the frequency range of the AC perturbation signal used in the programming mode or the erase mode of example embodiments. Because the AC conductivity increases as the frequency increases, the moving distance of the charges also increases when the frequency increases.

Therefore, the charges may be conducted by the AC perturbation pulse component, and the charges may be actively moved by the AC perturbation.

The AC conduction in the insulating material is a conduction caused by an increase in a mean free path of charges, not conduction with a direction of the charges, that is, DC conduction.

Therefore, when the AC perturbation pulse is applied to a charge trap flash memory device, the charges trapped in the charge trap layer, for example, the nitride material forming the charge trap layer, move actively. Accordingly, the thermalization rate of the charges may be improved. In addition, the recombination rate of the electrons and holes may be improved, and thus, the probability of generating the incomplete recombination may be reduced and the probability of remaining the opposite charges together also may be reduced.

In addition, in a case where the charges are trapped in a deep trap, the charges may be moved easily by the AC perturbation, thereby improving the recombination rate.

Figure 8A:
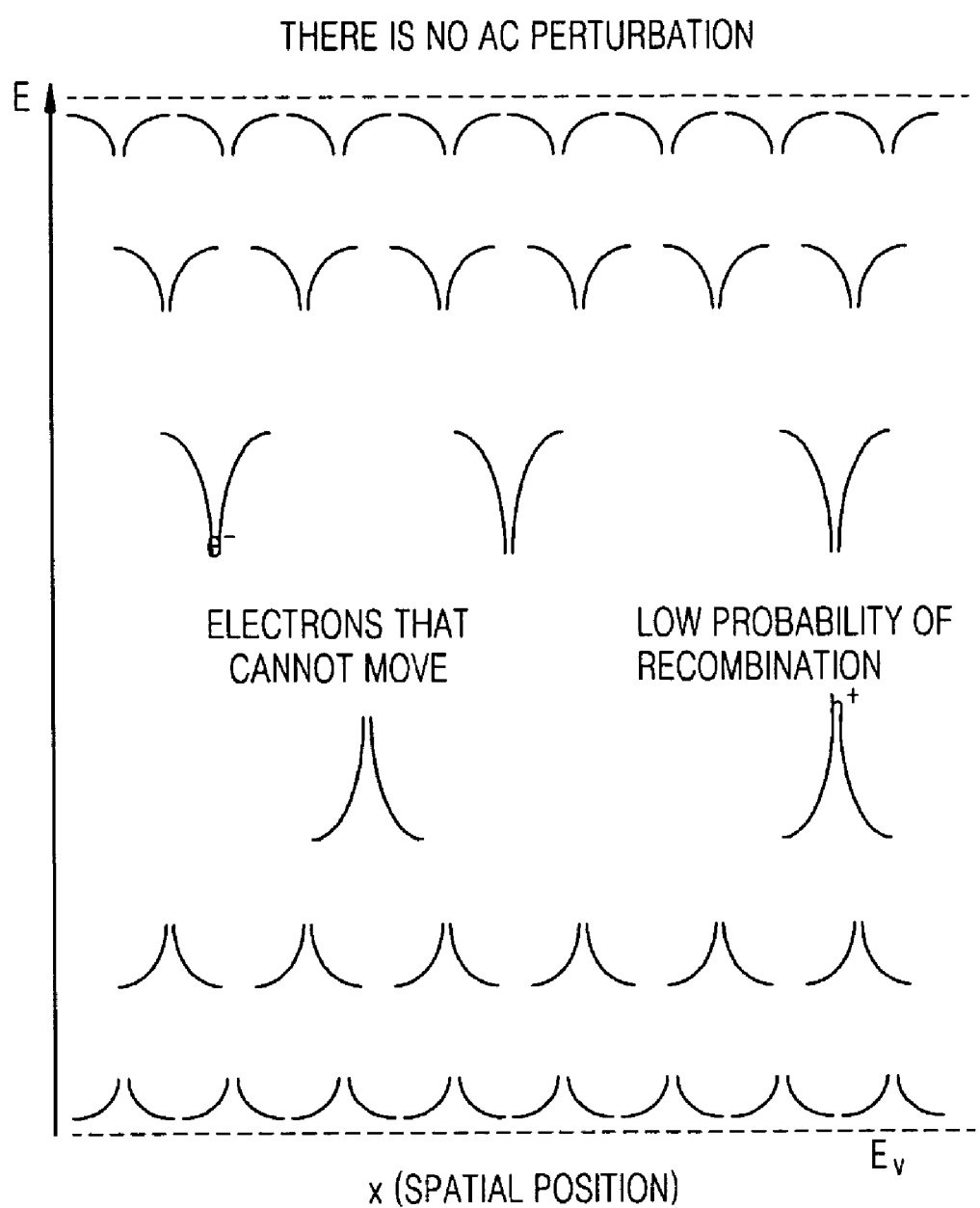
FIGS. 8A and 8B show example probabilities of recombination between electrons and holes in cases where there is no AC perturbation and there is an AC perturbation when an electron is trapped in a deep trap and cannot move.
Figure 8B:
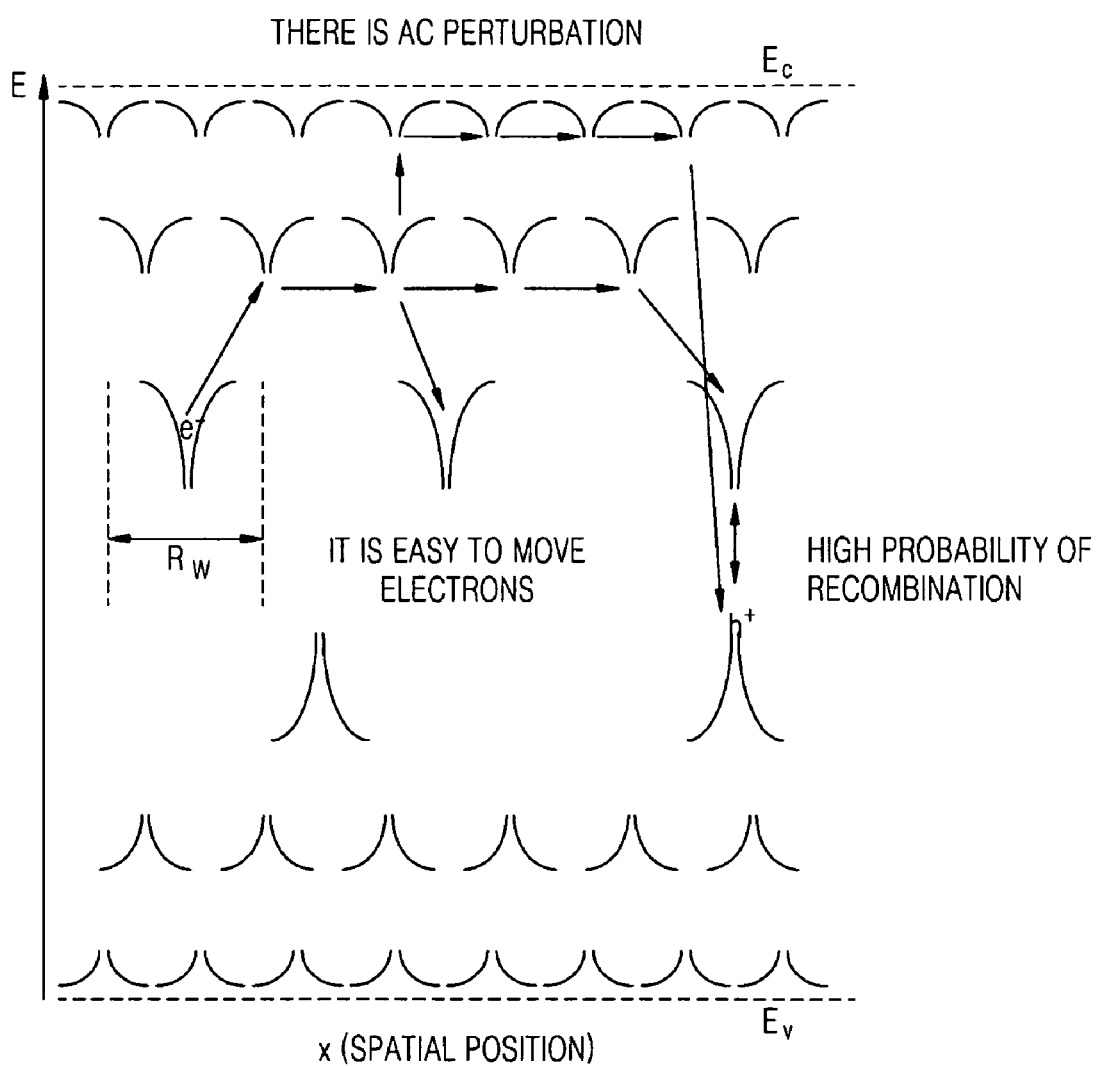

FIGS. 8A and 8B show the probabilities of the recombination of the electrons and holes when electrons that cannot move by being trapped in the deep trap exist in a case where there is no AC perturbation and in a case where there is the AC perturbation, respectively.

As shown in FIG. 8A, if there is no AC perturbation, it is difficult to recombine the electrons that cannot be moved by being trapped in the deep trap with the holes. However, as shown in FIG. 8B, if AC perturbation is applied, the electrons trapped in the deep trap can be moved by the AC perturbation, and thus, the probability of recombining the electrons with the holes may be increased. In example embodiments, the charges move randomly without any direction by the AC perturbation, and thus, the charges may not be substantially transferred even if there is the AC perturbation.

In FIGS. 2 through 5, the perturbation pulse included in the composite pulse that is applied to the charge trap flash memory device for performing the programming operation or the erase operation is an AC perturbation pulse, for example, an AC perturbation pulse that does not include the DC level having the opposite polarity to that of the DC pulse.

The perturbation pulse included in the composite pulse of example embodiments have a DC level of opposite polarity to that of the DC pulse in order to accelerate the recombination or the redistribution of the charges as shown in FIGS. 9, 14, 15A, 15B, 16A, and 16B, described later. That is, in the programming mode, if the DC pulse is a positive voltage, the DC level of the perturbation pulse may be a negative voltage. In the erase mode, if the DC pulse is a negative voltage, the DC level of the perturbation pulse may be a positive voltage. Hereinafter, the erase voltage and the programming voltage will be separately described for example embodiments where the perturbation pulse has a DC level of the opposite polarity to that of the DC pulse.

Figure 9:
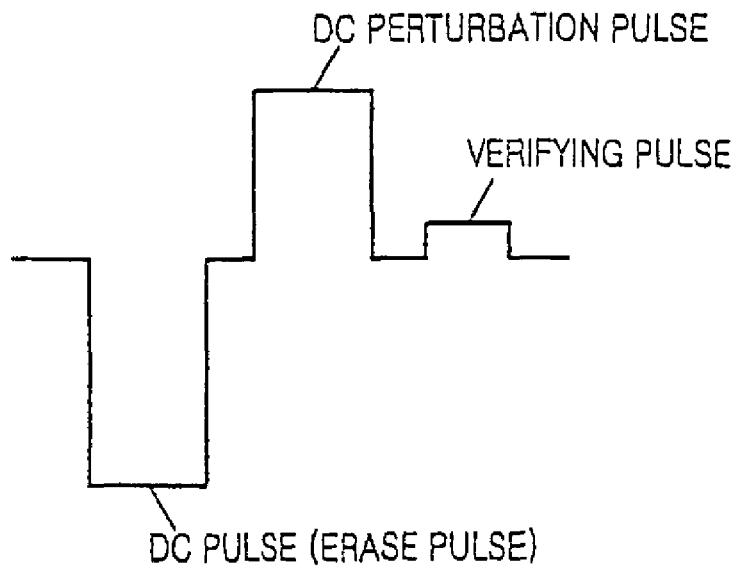
FIG. 9 is a diagram showing an erase voltage according to example embodiments.
Figure 10:
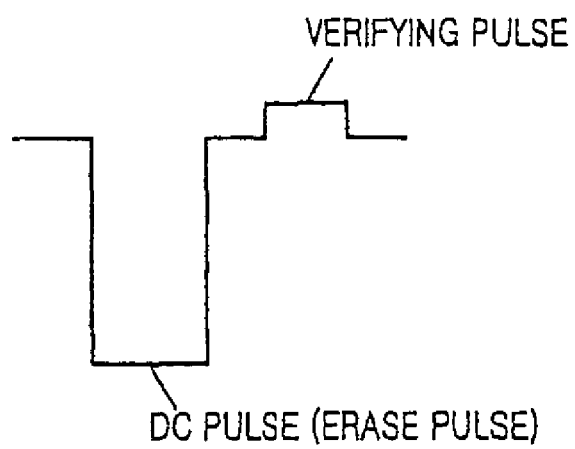
FIG. 10 is a diagram showing an erase voltage according to the conventional art.

FIG. 9 shows an erase voltage according to the method of operating the charge trap flash memory according to example embodiments. FIG. 10 shows an erase voltage according to the conventional operation method as a comparison example.

Referring to FIG. 9, the erase voltage of example embodiments is the voltage of composite pulse form including the erase pulse, that is, the DC pulse, and the perturbation pulse. In example embodiments, in the composite pulse, the erase pulse may be followed by the perturbation pulse, and the perturbation pulse may have a DC level of the opposite polarity to that of the erase pulse. That is, the erase voltage may include an erase pulse of a negative voltage and a perturbation pulse of a positive voltage.

In FIG. 9, the perturbation pulse is a DC perturbation pulse having the opposite polarity to that of the erase pulse.

In the erasing mode, the composite pulse including the erase pulse (DC) pulse) and the perturbation pulse may be applied to perform an erase operation. In addition, the verifying pulse voltage may be applied to identify whether the erase is performed properly. The verifying pulse voltage may have the opposite polarity to that of the erase pulse.

As a comparative example, referring to FIG. 10, the erase pulse voltage including only the DC pulse is applied to perform the erase operation, and after a predetermined time, the verifying pulse voltage is applied to identify whether the erase is properly performed or not according to the conventional art.

Figure 11:
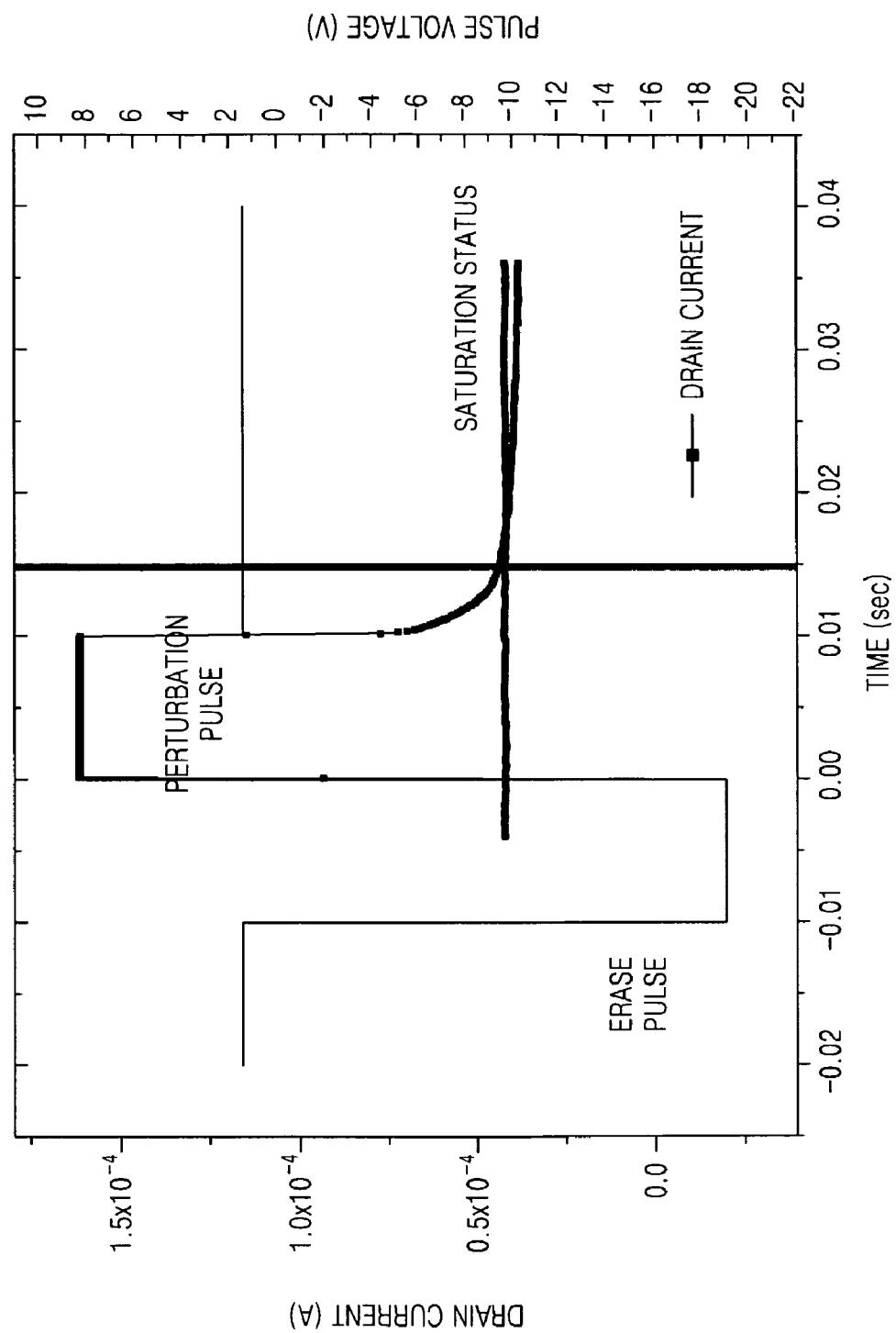
FIG. 11 is an example graph showing a variation in a drain current (Id) in a memory cell of the charge trap flash memory device when the erase operation is performed using the composite pulse of FIG. 9.
Figure 12:
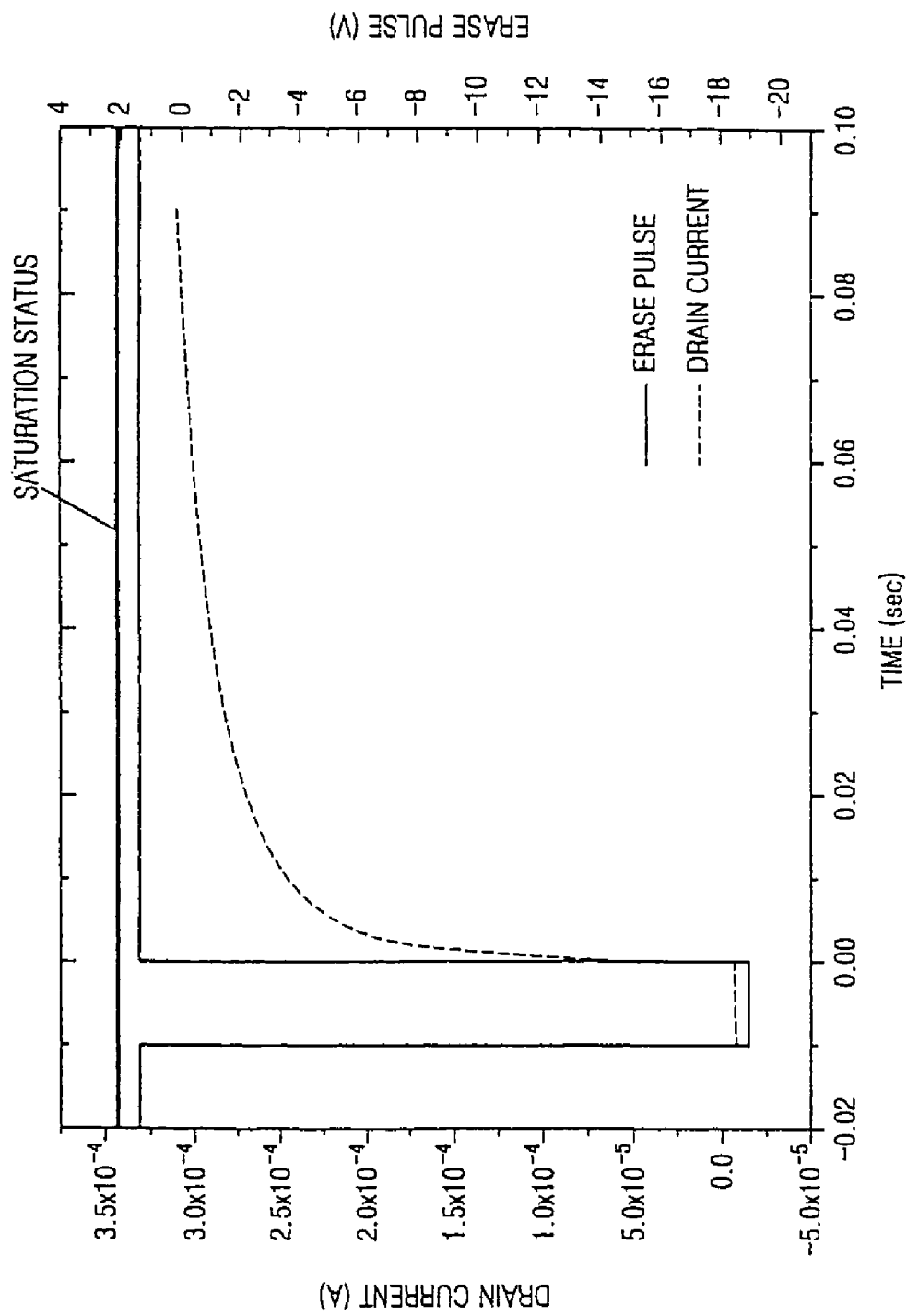
FIG. 12 is an example graph showing a variation in the drain current (Id) in a memory cell of a charge trap flash memory device when an erase pulse voltage of FIG. 10 including a DC pulse is applied.

FIG. 11 shows an example variation in a drain current (Id) according to the time in a memory cell of a charge trap flash memory when an erase operation is performed by applying the composite pulse of FIG. 9. FIG. 12 shows an example variation in the drain current (Id) in a memory cell of a charge trap flash memory device when an erase pulse voltage including only the DC pulse shown in FIG. 10 is provided.

In the memory cell of the charge trap flash memory device, the drain current increases according to the elapsed time when the erase pulse is applied, and then, is saturated to a predetermined value. An Id transient phenomenon, which increases the drain current according to the time, may be caused by redistribution of charges. The increase of the drain current according to the elapsed time means that the threshold voltage is reduced after applying the erase pulse.

As described above, due to the movement of the charges in the charge trap layer after performing the programming/erase operations, the threshold voltage (Vth) is changed according to the time after performing the programming operation and the erasing operation. Accordingly, an error occurs when the erase verification or the erase state is read after the erasing operation and the erase fails due to a generated verification error.

When the erasing operation is performed using the conventional method shown in FIG. 10, the saturation time is at least about 1 second as shown in FIG. 12, and thus, it is more difficult to obtain an erase decision rapidly and/or accurately.

Therefore, the saturation time of the threshold voltage after performing the erase operation must be efficiently reduced in order to obtain an erase decision more rapidly and/or accurately and to reduce or prevent an erase failure.

As shown in FIG. 9, in a case where a DC perturbation pulse having the opposite polarity to that of the erase pulse is applied before or after the erase pulse, the Id transient phenomenon may be accelerated so that the erase state may be saturated within a reduced time as shown in FIG. 11, and thus, the saturation time of the threshold voltage may be efficiently reduced. FIG. 11 shows the change of the drain current (Id) when a perturbation pulse having an opposite polarity to that of the erase pulse after applying the erase pulse voltage for 10 ms. In FIG. 11, the drain current is almost saturated after 15 ms.

Figure 13:
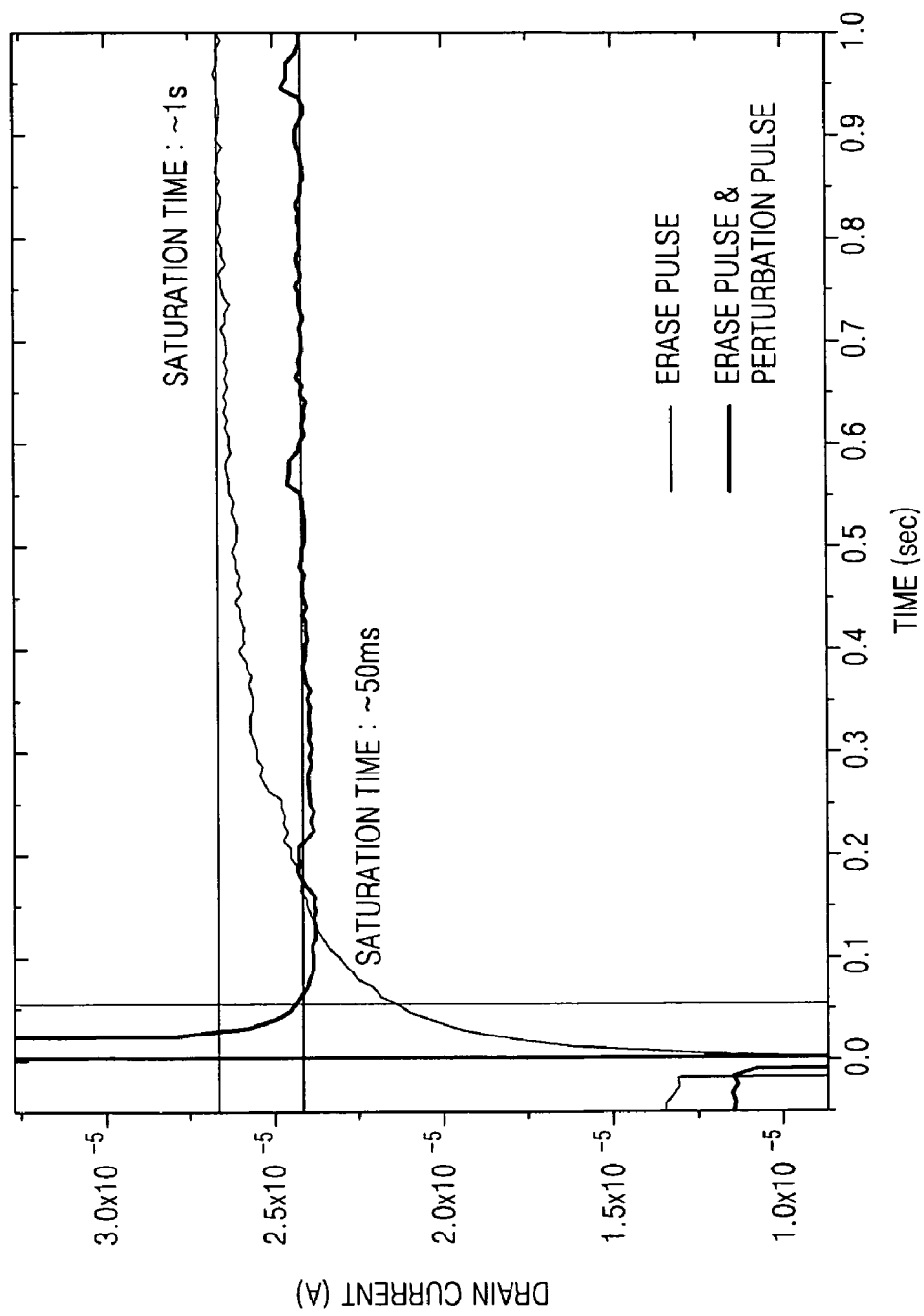
FIG. 13 is an example graph showing variations in the drain currents (Id) according to the elapse of time in a case of applying the composite pulse shown in FIG. 9, and in a case of applying the existing erase pulse voltage including the DC pulse shown in FIG. 10.

FIG. 13 shows example variations of the drain currents (Id) when the composite pulse of FIG. 9 is applied, and when the conventional erase pulse voltage including the DC pulse shown in FIG. 10 is applied.

As shown in FIG. 13, when the composite pulse of FIG. 9 according to example embodiments is applied, the saturation time of the drain current, that is, the saturation time of the threshold voltage may be reduced. Therefore, according to example embodiments using the composite pulse of FIG. 9 in the erase operation, a more rapid erase decision may be performed by applying the verifying pulse voltage after performing the erase operation, and erase failure caused by an error generated in the erase verification operation and in reading operation of the erase state after the erase operation may be reduced or prevented.

In FIG. 9, the composite pulse includes an erase pulse and the DC perturbation pulse having an opposite polarity to that of the erase pulse.

Figure 14:
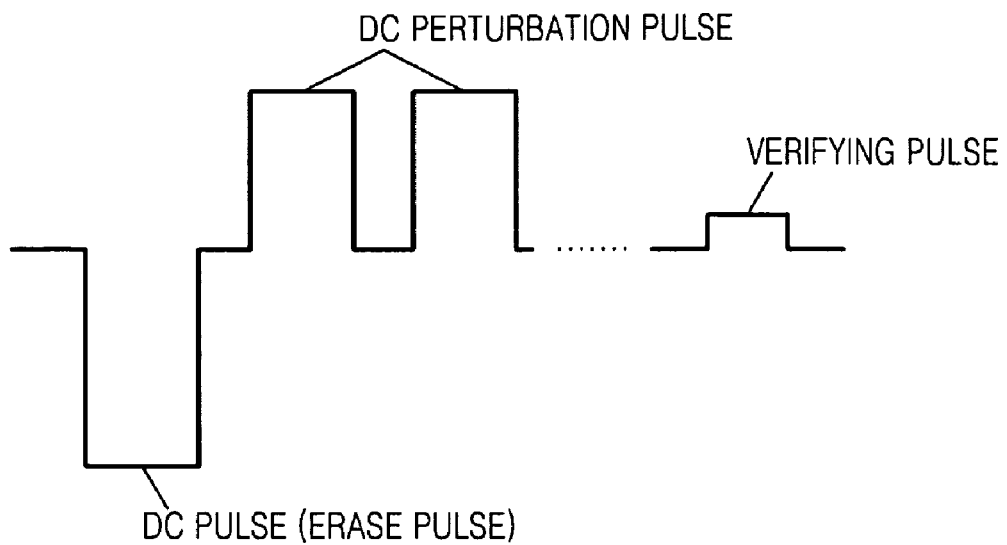
FIGS. 14, 15A, and 15B are diagrams showing erase voltages according to example embodiments.

In example embodiments, the composite pulse for performing an erase operation may include an erase pulse and a plurality of DC perturbation pulses having the opposite polarity to that of the erase pulse as shown in FIG. 14.

Figure 15A:
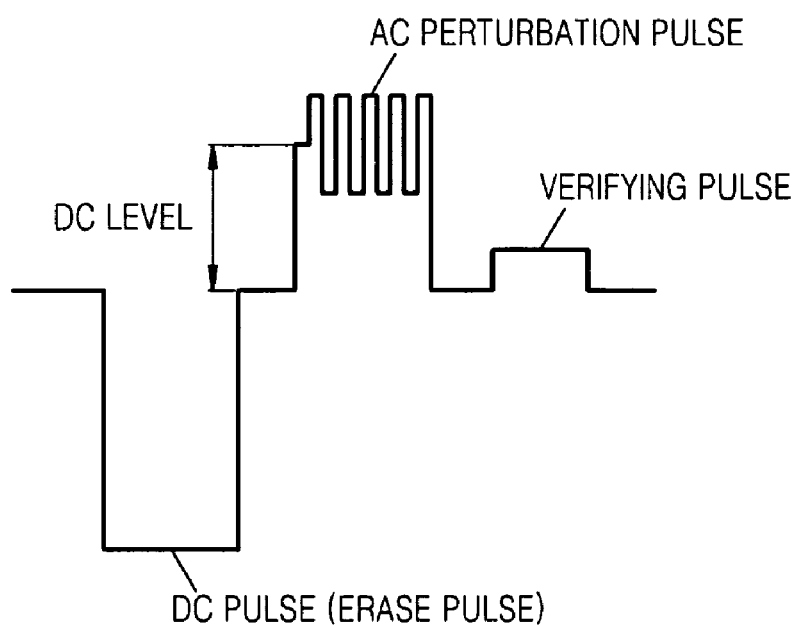
Figure 15B:
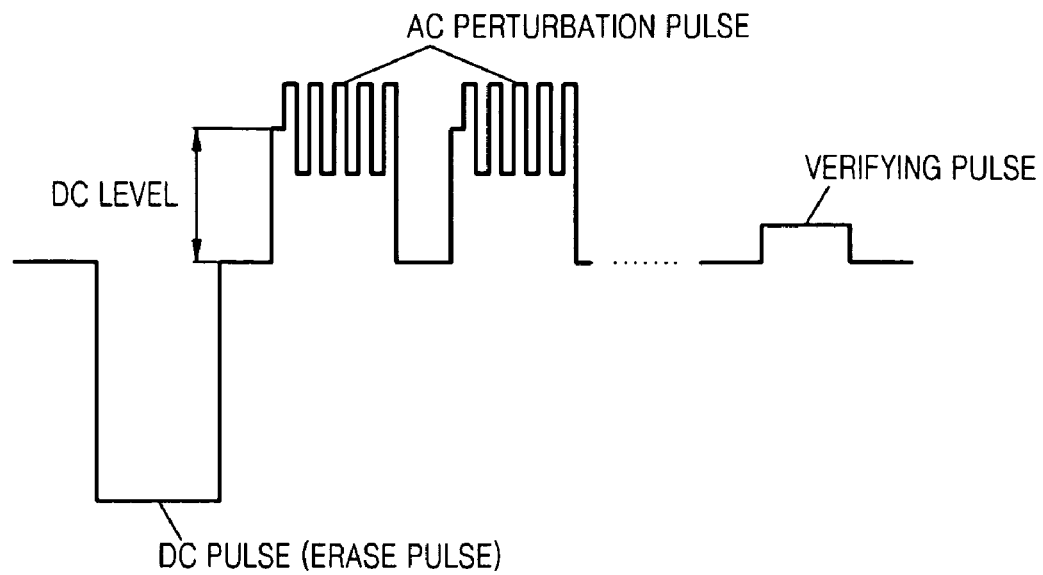

In addition, as shown in FIGS. 15A and 15B, a composite pulse for performing an erase operation may have an erase pulse and an AC perturbation pulse overlapping with the DC level having the opposite polarity to that of the erase pulse that is modified from the composite pulse shown in FIGS. 9 and 14.

A perturbation pulse having the DC level of the opposite polarity to that of the DC pulse described with reference to FIGS. 9 through 15B may be applied in the programming mode.

Figure 16A:
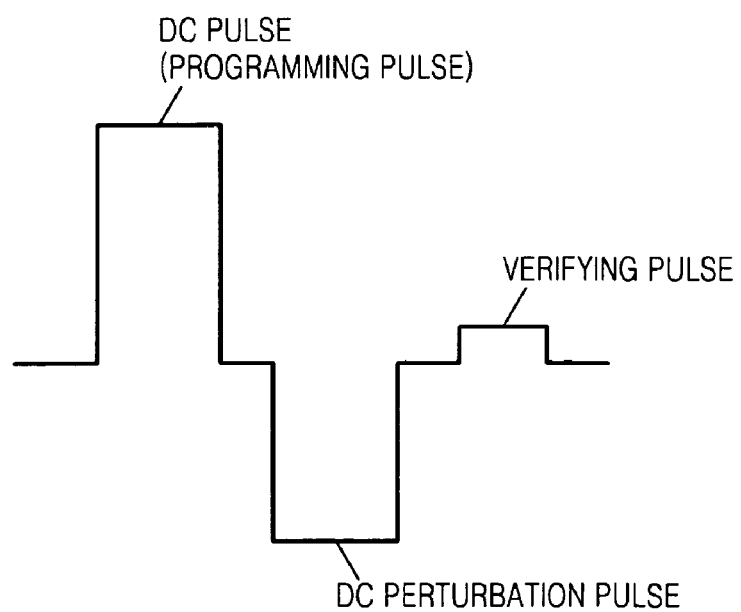
FIGS. 16A and 16B are diagrams showing programming voltages according to example embodiments.
Figure 16B:
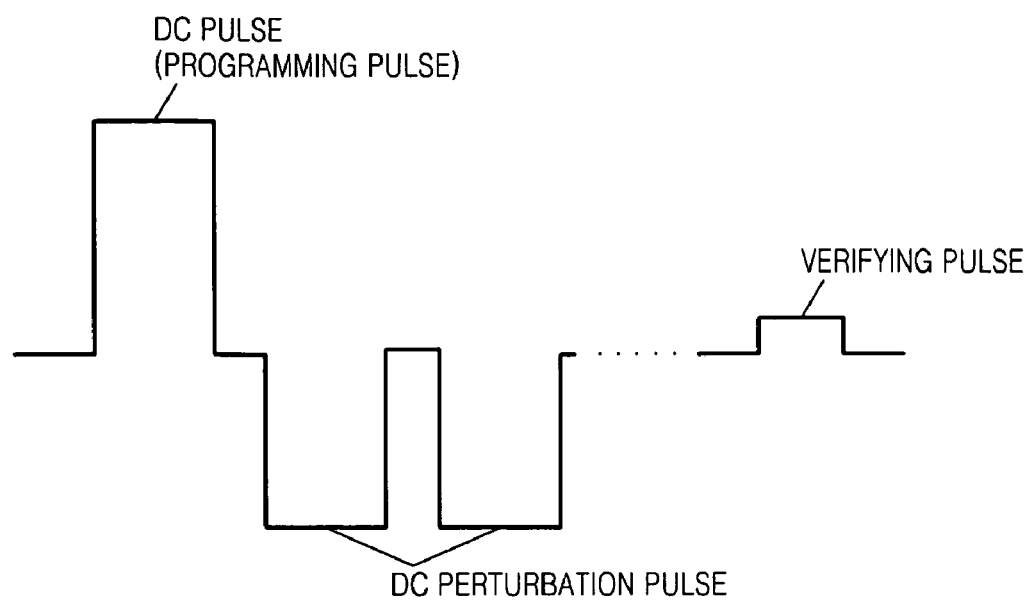

FIGS. 16A and 16B show programming voltages, corresponding to FIGS. 9 and 14, respectively, according to example embodiments.

As shown in FIG. 16A, a composite pulse for performing the programming operation may include a programming pulse, that is, a DC pulse, followed by a DC perturbation pulse having the opposite polarity to that of the programming pulse.

In addition, as shown in FIG. 16B, a composite pulse for performing a programming operation may include a programming pulse, that is, the DC pulse, followed by a plurality of DC perturbation pulses having the opposite polarity to that of the programming pulse.

As another example, a composite pulse for performing a programming operation may include a programming pulse and an AC perturbation pulse overlapping with the DC level having the opposite polarity to that of the programming pulse, so as to correspond to the erase voltages shown in FIGS. 15A and 15B. This composite pulse may be inferred using the programming voltage shown in FIGS. 16A and 16B and the erase voltage characteristics of FIGS. 15A and 15B, and thus, the composite pulse is not shown in the drawings.

Figure 17A:
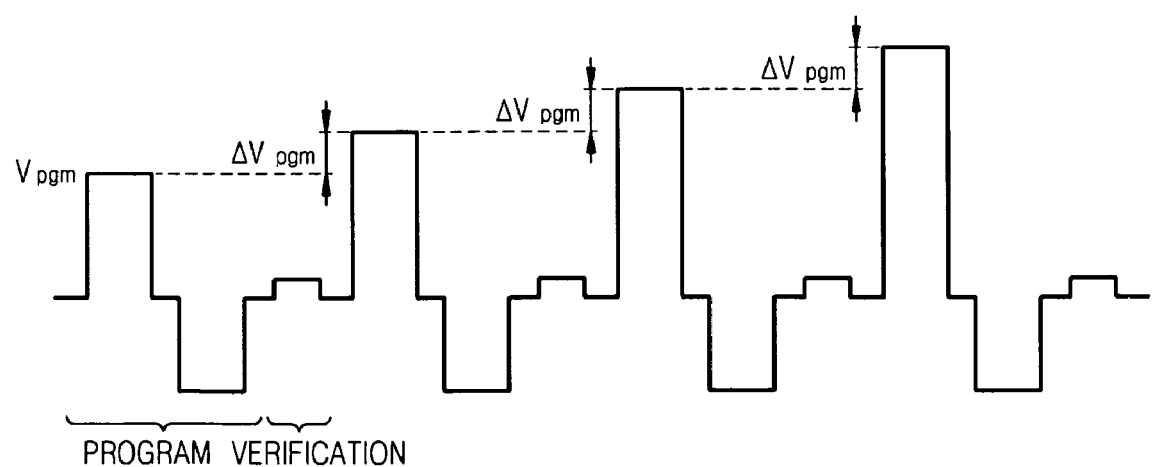
FIGS. 17A and 17B are example diagrams showing programming voltages when the programming is performed in the ISPP method using the programming voltages shown in FIGS. 16A and 16B.
Figure 17B:
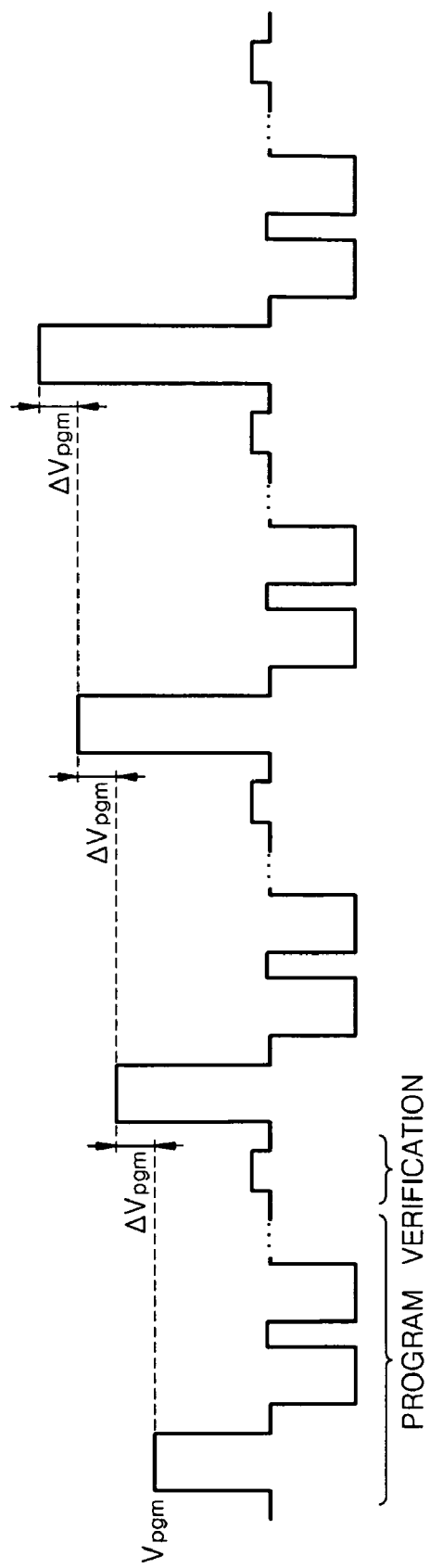

FIGS. 17A and 17B show programming voltages when programming is performed using an ISPP method using programming voltages shown in FIGS. 16A and 16B. FIGS. 17A and 17B show that example embodiments may be applied in an ISPP programming method. In FIGS. 17A and 17B, Vpgm denotes a basic program pulse voltage in the ISPP programming, and $\Delta$Vpgm denotes an increase amount of the program pulse voltage magnitude in the ISPP method.

When the method of operating the charge trap flash memory device of example embodiments is applied to the ISPP type programming, a program pulse having a predetermined or desired magnitude may be applied to perform the programming operation, and then, the perturbation pulse may be applied to accelerate the saturation of the threshold voltage. In addition, the verifying pulse voltage may be applied to identify whether the threshold voltage reaches the programming state. If the threshold voltage does not reach the programming state, the magnitude of the program pulse may be increased by a predetermined or desired level, and the above processes are repeated. The processes are repeated a plurality of times until the threshold voltage reaches the programming state.

A method of operating the charge trap flash memory device according to example embodiments may be applied to a structure in which the charge trap flash memory device is arranged in NAND type as shown in FIG. 18.

Figure 18A:
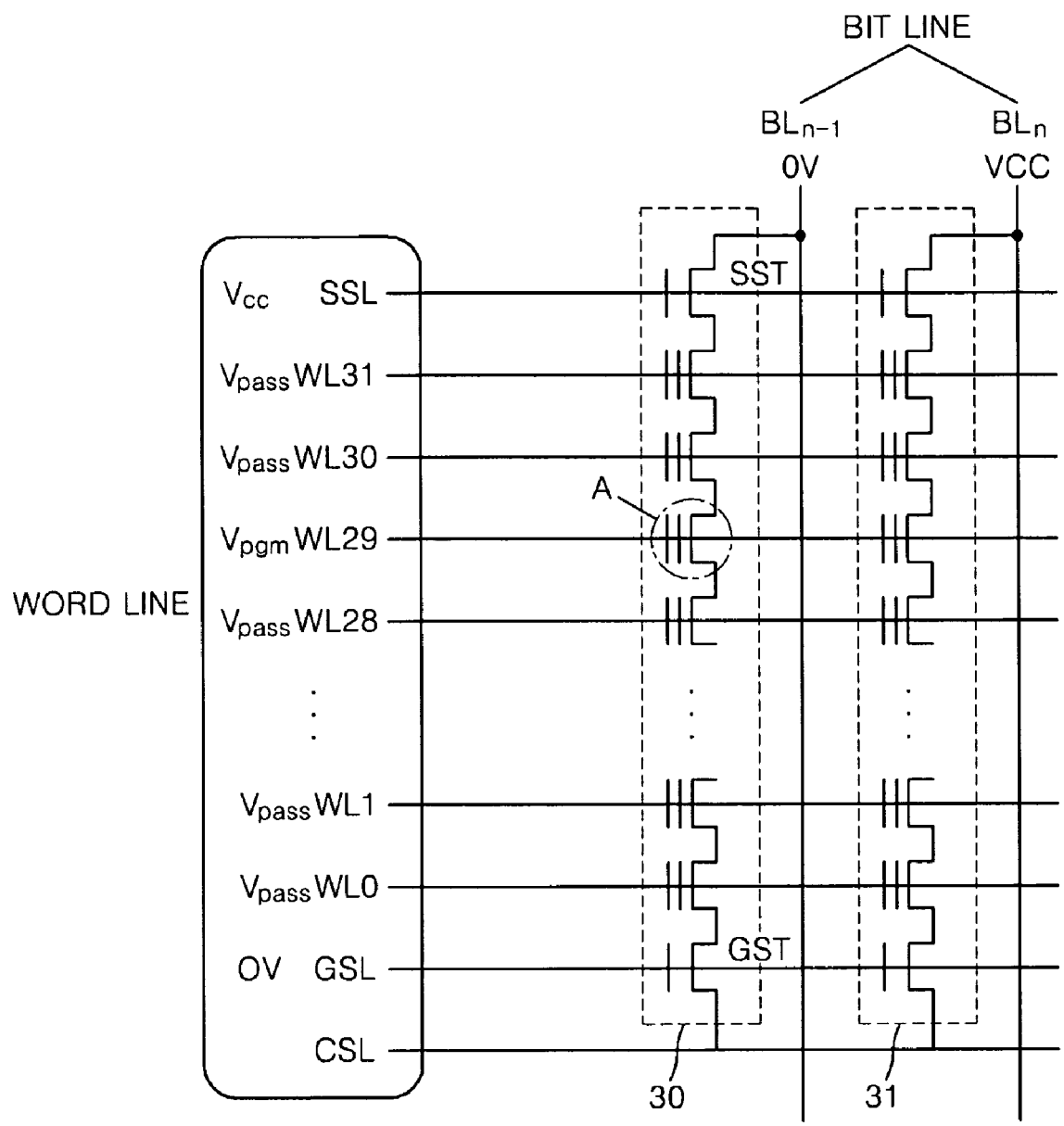
Figure 18B:
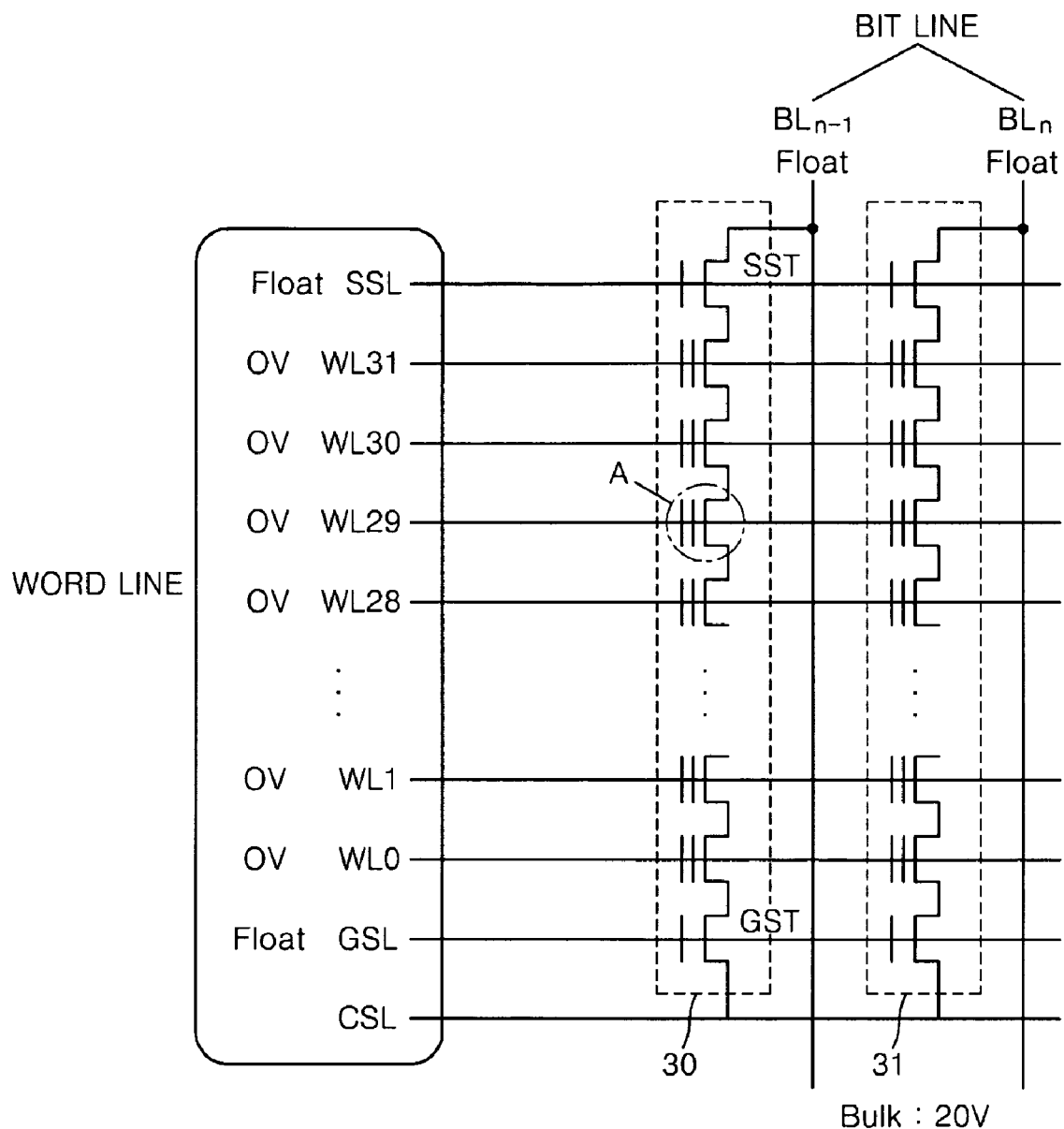

FIGS. 18A and 18B show an example of a circuit diagram of a NAND flash memory device using the operating method of example embodiments, FIG. 18A shows an example programming operation state and FIG. 18B shows an example erase operation state.

Referring to FIGS. 18A and 18B, the NAND charge trap flash memory device includes a plurality of cell strings. In FIGS. 18A and 18B, two cell strings 30 and 31 are shown as an example.

Each of the cell strings 30 and 31 may include a plurality of charge trap memory cell arrays sharing the source and drain with an adjacent charge trap memory cell. Each of the charge trap memory cells in the cell string may have the structure shown in FIG. 1, for example.

A ground selection transistor (GST), a plurality of memory cells, and/or a string selection transistor (SST) may be serially connected to the cell string. An end of the cell string may be connected to the bit line, and the other end of the cell string may be connected to a common source line (CSL). The GST may be connected to the CSL, and the SST may be connected to the bit line.

Word lines (WL) may be connected to gate electrodes of the plurality of charge trap memory cells in a direction crossing the cell strings. In addition, a string selection line (SSL) may be connected to a gate of the SST, and a ground selection line (GSL) may be connected to a gate of the GST.

The data programmed in a charge trap memory cell may vary with the voltage of the bit line. If the voltage of the bit line is a power source voltage (Vcc), programming may be inhibited. On the other hand, if the voltage of the bit line is a ground voltage (0V), a program is performed. FIG. 18A shows as an example where the ground voltage (0V) is applied to the bit line BLn−1, and the power source voltage (Vcc) is applied to the bit line BLn.

In the programming mode, the programming voltage, that is, the composite pulse voltage for performing the programming operation, may be applied to the selected word line, for example, WL29. A pass voltage (Vpass) may be applied to word lines that are not selected, for example, WL31, WL30, WL28, ..., WL0. The DC pulse voltage (Vpgm) of the programming voltage, that is, the composite pulse, starts from, for example, 16V and increases by, for example, 0.5V, and the pass voltage (Vpass) may be, for example, 9V.

In the selected word line WL29, the charge trap memory cell included in the bit line BLn−1, to which the ground voltage is applied, is programmed. In FIG. 18A, the charge trap memory cell A is programmed. Referring to FIG. 18B, in the erase mode, the bit line, the SSL, and the GSL all float, the ground voltage 0V is applied to the word lines W0-W31, and the erase voltage, that is, the composite pulse voltage for performing the erase operation, is applied to the bulk, that is, the substrate. FIG. 18B shows as an example that the DC pulse voltage of the composite pulse for performing the erase operation is 20V.

According to example embodiments, a perturbation pulse may be applied in addition to a DC pulse in the programming operation or the erase operation, and thus, charges may actively move in the charge trap layer. Accordingly, the thermalization speed of the charges and/or the recombination speed of the charges may be improved, and the probability of generating incomplete recombination may be reduced, and thus, the remaining of opposite charges in the charge trap layer may be reduced. Therefore, the stabilities of the erase state and the program state may be improved, the probability of degrading the dispersion of the threshold voltages in the program state and the erase state may be reduced, and the change of threshold voltage value in the HTS operation may be reduced or prevented.

Example embodiments of composite pulses and methods of programming and/or erasing may be applied to various non-volatile memories, for example flash memories. Example embodiments of composite pulses and methods of programming and/or erasing may be applied to floating gate memories and/or charge trap memories. Example embodiments of composite pulses and methods of programming and/or erasing may be applied to NAND memories and/or NOR memories.

While the example embodiments have been particularly shown and described, it will be understood by those of ordinary skill in the art that various changes in form and details may be made therein without departing from the spirit and scope of example embodiments as defined by the following claims.

What is claimed is:

1. A method of operating a nonvolatile memory device to perform at least one of a programming operation and an erase operation, the method comprising:
   applying a composite pulse including a direct current (DC) pulse and an alternating current (AC) perturbation pulse to a charge storage nonvolatile memory device to perform at least one of the programming operation and the erase operation,
   wherein the charge storage nonvolatile memory device is a charge trap memory device,
   the charge trap memory device includes
      a semiconductor layer, and
      a gate structure on the semiconductor layer, the gate structure including a tunnel insulating layer, a charge trap layer, a blocking insulating layer, and a gate electrode, and
   the composite pulse is applied to the gate electrode in a program mode, and the composite pulse is applied to the semiconductor layer in an erase mode.

2. The method of claim 1, wherein in the composite pulse, the DC pulse is followed by the AC perturbation pulse.

3. The method of claim 1, wherein the composite pulse includes the DC pulses and the AC perturbation pulse that are alternately arranged a plurality of times.

4. The method of claim 1, wherein the composite pulse includes the DC pulse and the AC perturbation pulse overlapping with a DC level that has the same polarity as that of the DC pulse and has a smaller magnitude,
   wherein the DC pulse and the AC perturbation pulse are alternately arranged a plurality of times.

5. The method of claim 1, wherein the composite pulse includes the DC pulse for a time period, and the AC perturbation pulse overlaps with the DC pulse.

6. The method of claim 1, wherein the AC perturbation pulse has a frequency that is higher than an inverse of a time period including the DC pulse.

7. The method of claim 1, wherein the composite pulse includes the DC pulse followed by the AC perturbation pulse, and
   the AC perturbation pulse has a DC level having opposite polarity to that of the DC pulse.

8. The method of claim 7, wherein a magnitude of the DC level of the AC perturbation pulse is smaller than that of the DC pulse.

9. The method of claim 1, wherein the nonvolatile memory device is a flash memory device.

10. The method of claim 1, wherein the charge trap memory device is a NAND or Nor charge trap memory device.

11. The method of claim 1, wherein the tunnel insulating layer is an oxide layer, the charge trap layer is a nitride layer, the blocking insulating layer includes a high dielectric material, and the gate electrode is formed of a metal layer.

12. The method of claim 1, wherein the DC pulse is a basic pulse of the programming operation or the erase operation.

13. The method of claim 1, wherein the AC perturbation pulse accelerates a recombination or a redistribution of charges.

14. The method of claim 1, further comprising:
applying a verifying pulse after the composite pulse to verify at least one of the program state and the erase state.

15. The method of claim 14, wherein the application of the composite pulse and the application of the verifying pulse are performed while gradually increasing the DC pulse of the composite pulse in the program mode.

* * * * *